United States Patent
Oppelt et al.

(10) Patent No.: US 7,737,787 B2
(45) Date of Patent: Jun. 15, 2010

(54) IMPEDANCE-MAPPING AMPLIFIER CIRCUIT WITH EXCLUSIVELY REACTIVE NEGATIVE FEEDBACK

(75) Inventors: Ralph Oppelt, Uttenreuth (DE); Markus Vester, Nuernberg (DE)

(73) Assignee: Siemens Aktiengesellschaft, Munich (DE)

( * ) Notice: Subject to any disclaimer, the term of this patent is extended or adjusted under 35 U.S.C. 154(b) by 6 days.

(21) Appl. No.: 12/331,512

(22) Filed: Dec. 10, 2008

(65) Prior Publication Data
US 2009/0179705 A1    Jul. 16, 2009

(30) Foreign Application Priority Data
Dec. 10, 2007    (DE) .................. 10 2007 059 350

(51) Int. Cl.
*H03F 3/04* (2006.01)
(52) U.S. Cl. ..................... 330/302; 330/294
(58) Field of Classification Search ................ 330/302, 330/294, 296, 285
See application file for complete search history.

(56) References Cited

U.S. PATENT DOCUMENTS

| | | | |
|---|---|---|---|
| 5,805,023 A | 9/1998 | Fukuden | |
| 6,275,113 B1 * | 8/2001 | Nakano et al. | 330/305 |
| 7,180,372 B2 * | 2/2007 | Proehl | 330/295 |
| 7,382,196 B2 * | 6/2008 | Huang | 330/302 |

* cited by examiner

*Primary Examiner*—Henry K Choe
(74) *Attorney, Agent, or Firm*—Schiff Hardin LLP

(57) ABSTRACT

An amplifier circuit has a transistor element that has an input terminal, an output terminal) and a third terminal. An input signal to be amplified is supplied to the input terminal. The amplified input signal is emitted as an output signal at the output terminal. The input terminal is connected with the output terminal via a first reactance. The third terminal is connected via a second reactance with a zero potential. One of the reactances is fashioned as an inductor and the other of the reactances is fashioned as a capacitor. An inductance value of the inductor and a capacitance value of the capacitor are dimensioned such that the quotient of the inductance value of the inductor and the capacitance value of the capacitor is equal to the product of a desired input impedance that is effective at the input terminal and an output impedance associated with the output impedance. Based on this dimensioning, the output impedance associated with the output terminal is mapped to the input terminal at the same level or scaled.

8 Claims, 3 Drawing Sheets

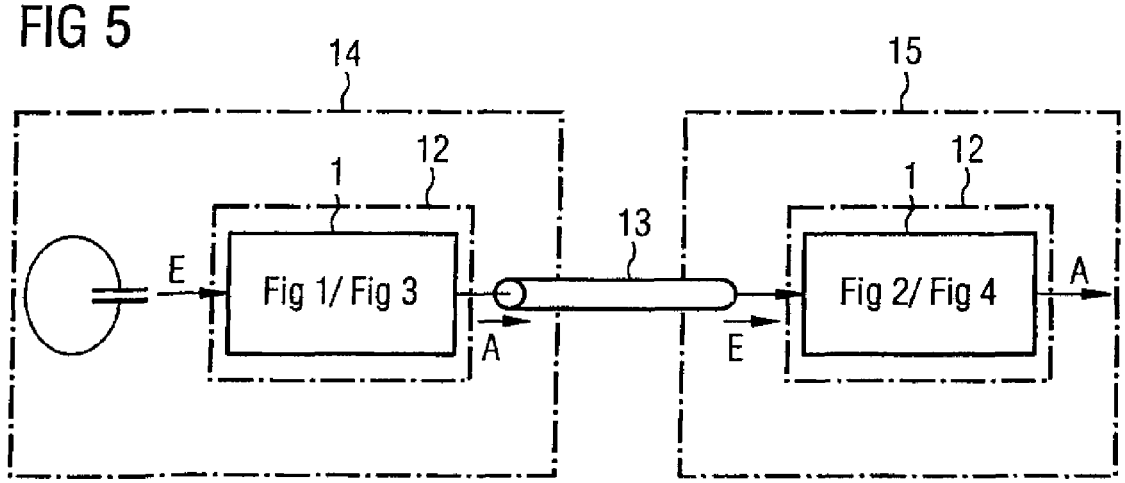

IMPEDANCE-MAPPING AMPLIFIER CIRCUIT WITH EXCLUSIVELY REACTIVE NEGATIVE FEEDBACK

BACKGROUND OF THE INVENTION

1. Field of the Invention

The present invention concerns an amplifier circuit, of the type wherein the amplifier circuit has a transistor element with an input terminal, an output terminal and a third terminal, wherein an input signal to be amplified is supplied to the input terminal, and wherein the amplified input signal is emitted as an output signal at the output terminal.

2. Description of the Prior Art

Amplifier circuits of the above type are generally known. In such amplifier circuits the input terminal is normally connected with the output terminal via an ohmic resistor. The third terminal is connected with a zero potential via an additional ohmic resistor. For example, such an amplifier circuit is known from the prospectus from August 1990, "RF & Microwave Signal Processing Components" by the Adams-Russell Corporation. In principle this amplifier already works quite well; but it exhibits poor noise properties, in particular for a relatively small amplification factor.

An amplifier circuit of the type described above is likewise known from DE 10 2005 038 442 A1 and the corresponding US 2007/0040612 A1. In this amplifier circuit, the input terminal is connected with the output terminal via a negative feedback transformer. A similar design is known from the reference book "Breitbandige Ferrit-Hochfrequenztransformatoren—Schaltungen und Systeme" ["Broadband Ferrite High-Frequency Transformers—Circuits and Systems"] by Joachim von Parpart, Hohig Verlag, Heidelberg, 1997; see Page 125 there, for example. These amplifier circuits do in fact exhibit advantageous noise properties, but they require optimally securely coupled transformers as directional couplers, which is why ferrite must be used in the directional couplers thereof. Therefore they cannot be used in environments in which strong magnetic fields predominate.

Additional amplifier circuits of the type described above are known from U.S. Pat. Nos. 5,164,682 and 4,156,173.

An amplifier circuit of the type cited above is also known from U.S. Pat. No. 5,805,023. In this amplifier circuit the input terminal is connected with the output terminal via a first reactance. The third terminal is connected via a second reactance with a zero potential. One of the reactances is fashioned as an inductor, the other of the reactances as a capacitor.

SUMMARY OF THE INVENTION

An object of the present invention is to provide an amplifier circuit that operates with low noise even with a relatively low amplification factor, in which amplifier circuit a load impedance associated with the output forms at the input at the same level or scaled by a factor, and which can also be used in environments charged with magnetic fields.

According to the invention, in an amplifier circuit of the latter type described above, an inductance value of the inductor and a capacitance value of the capacitor are dimensioned such that the quotient of the inductance value of the inductor and the capacitance value of the capacitor is equal to the product of a desired input impedance acting at the input terminal and an output impedance associated with the output impedance. In particular, this achieves the result that the output impedance associated with the output terminal is mapped to the input terminal at the same level or scaled.

The transistor element can be fashioned as needed. In particular, it can alternatively be fashioned as a bipolar transistor or as a field effect transistor.

It is possible that the first reactance is fashioned as an inductor and the second reactance is fashioned as a capacitor. However, the reverse design is likewise possible and is in principle equivalent to the first cited embodiment.

If the first reactance is fashioned as an inductor, the inductance value of the inductor advantageously satisfies the relationship $$L = \frac{g\sqrt{Z_E Z_A}}{\omega_0}$$

The capacitance value of the capacitor in this case preferably satisfies the relationship $$C = \frac{g}{\omega_0 \sqrt{Z_E Z_A}}$$

wherein L is the inductance value, C the capacitance value, $\omega_0$ is a nominal frequency multiplied with $2\pi$, g is an amplification factor effective at the nominal frequency, $Z_E$ and $Z_A$ are the desired input impedance effective at the input terminal and the output impedance associated with the output terminal.

If, in reverse, the first reactance is fashioned as a capacitor and the second reactance is fashioned as an inductor, the inductance value of the inductor and the capacitance value of the capacitor advantageously satisfy the relationships $$L = \frac{\sqrt{Z_E Z_A}}{g\omega_0} \text{ and } C = \frac{1}{g\omega_0 \sqrt{Z_E Z_A}}$$

The amplification factor of the amplifier circuits according to the invention is frequency-dependent. If the input signal is monofrequent or relatively narrowband, the use of one amplifier circuit is nevertheless normally sufficient. By contrast, if the input signal is broadband, a series circuit is advantageously used in which two amplifier circuits according to the invention are connected with one another in series. In one of these two amplifier circuits the first reactance is fashioned as an inductor, the second reactance as a capacitor. It is reversed in the other amplifier circuit. Through this design, the frequency dependencies of the amplifier circuits mutually compensate one another so that an at least essentially constant total amplification can be achieved over a large frequency range.

The two amplifier circuits can be arranged close to one another, in particular even on a printed circuit board common to the amplifier circuits, but this is not required. In another embodiment of the present invention, each of the amplifier circuits can be arranged on its own printed circuit board.

The two circuit boards in the latter cited case can be arranged far removed from one another. The amplifier circuits are connected with one another by a shielded cable that has a suitable characteristic impedance.

DESCRIPTION OF THE DRAWINGS

FIGS. 3 and 4 respectively are circuit diagrams of embodiments of the amplifier circuits of FIGS. 1 and 2 and FIG. 5 is a series circuit of two amplifier circuits according to the invention.

DESCRIPTION OF THE PREFERRED EMBODIMENTS

Figure 1:
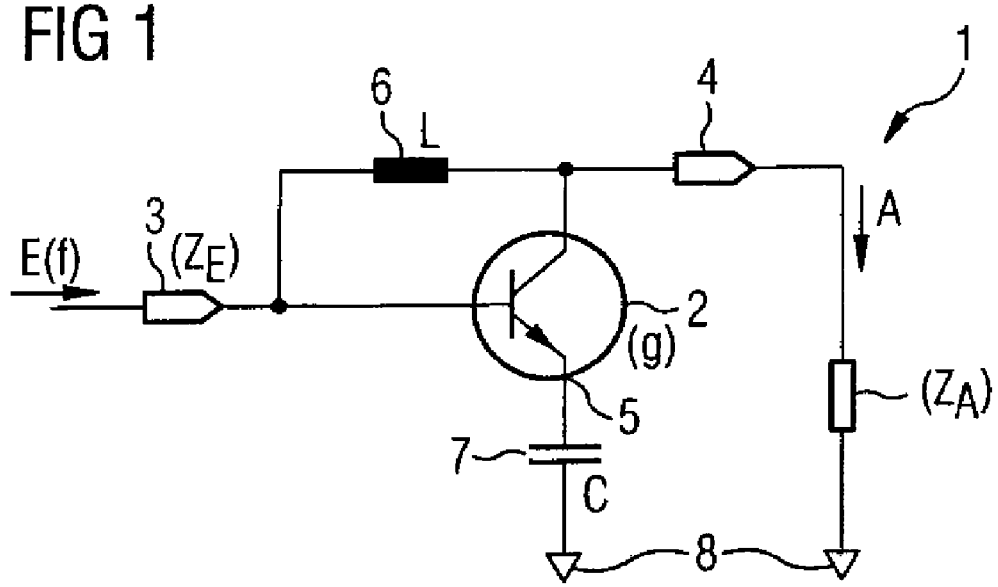
FIGS. 1 and 2 respectively schematically illustrate embodiments of an amplifier circuit according to the invention.
Figure 2:
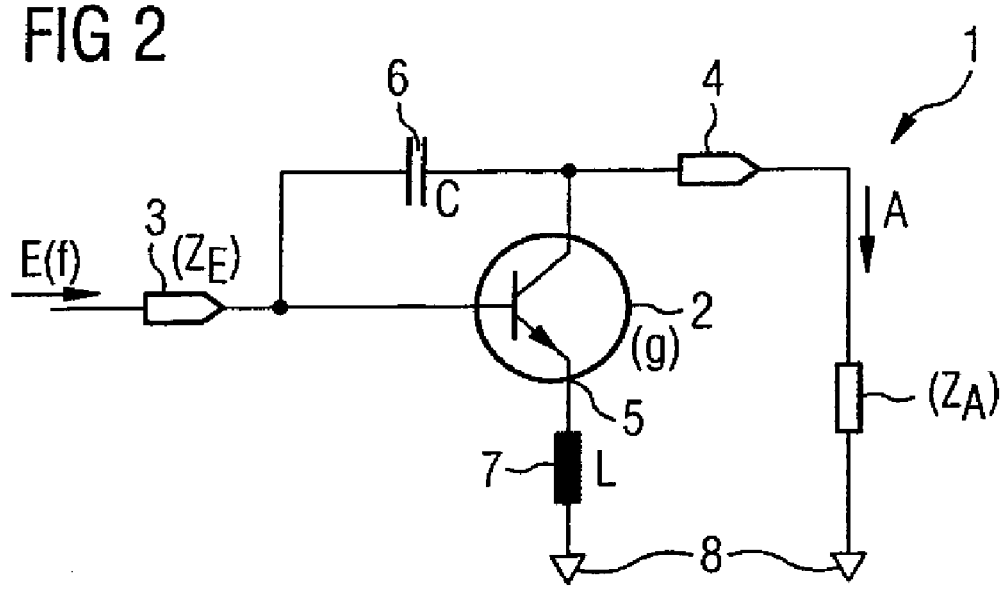

According to FIGS. 1 and 2, an amplifier circuit 1 possesses a transistor element 2. The transistor element 2 possesses an input terminal 3, an output terminal 4 and a third terminal 5.

In the representations according to FIGS. 1 and 2, the transistor element 2 is fashioned as a bipolar transistor. In this case, the input terminal 3 corresponds to the base of the transistor element 2, the output terminal 4 to the collector of the transistor element 2 and the third terminal 5 to the emitter of the transistor element 2. Alternatively, the transistor element 2 could be fashioned as a field effect transistor. In this case, the input terminal 3 would correspond to the gate of the field effect transistor, the output terminal 4 to the drain and the third terminal 5 to the source.

According to FIGS. 1 and 2, an input signal E is supplied to the input terminal 3. The input signal E either exhibits a nominal frequency f or lies in a frequency range that extends from a minimum frequency fmin up to a maximum frequency fmax. The nominal frequency f in this case lies in the frequency range defined by the minimum frequency fmin and the maximum frequency fmax. It can be equal to the geometric mean of minimum frequency fmin and maximum frequency fmax or lie near this mean.

The input signal E is amplified into an output signal A by means of the transistor element 2. The output signal A is emitted at the output terminal 4. If the input signal E exhibits the nominal frequency f, the output signal A is hereby amplified by an amplification factor g relative to the input signal E. g is the power amplification of the amplifier circuit 1, thus the ratio of output power to input power.

According to FIGS. 1 and 2, the input terminal 3 is connected with the output terminal via a first reactance 6. According to FIG. 1, the first reactance 6 is hereby fashioned as an inductor; according to FIG. 2, as a capacitor. Furthermore, the third terminal 5 is connected via a second reactance 7 with a zero potential 8. According to FIG. 1, the second reactance 7 is fashioned as a capacitor; according to FIG. 2, as an inductor. In both the embodiment according to FIG. 1 and the embodiment according to FIG. 2, one of the reactances 6, 7 is thus fashioned as an inductor, the other of the reactances 6, 7 as a capacitor.

In the case of the embodiment according to FIG. 1, the inductance value L of the inductor satisfies the relationship $$L = \frac{g\sqrt{Z_E Z_A}}{\omega_0}$$

The capacitance value C satisfies the relationship $$C = \frac{g}{\omega_0 \sqrt{Z_E Z_A}}$$

wherein $\omega_0$ is the nominal frequency f multiplied by $2\pi$, and thus corresponds to a nominal angular frequency. $Z_E$ is the desired input impedance effective at the input terminal 3. $Z_A$ is the output impedance associated with the output terminal 4. The relationship $$\frac{L}{C} = Z_E Z_A$$

therefore applies both in the embodiment according to FIG. 1 and in the embodiment according to FIG. 2.

The input impedance $Z_E$ normally lies between one tenth and ten times the output impedance $Z_A$. Often the input impedance $Z_E$ and the output impedance $Z_A$ lie between 50 and 200 Ohm. They can be equal in magnitude.

In the representations according to FIGS. 1 and 2, only the alternating voltage signal path is shown. Components that are required for the adjustment of a direct voltage operating point and/or for a direct voltage decoupling within the amplifier circuits 1 and outside thereof have been omitted in FIGS. 1 and 2 for simplicity. This type of presentation is generally known and accepted by those skilled in the art. The corresponding complete circuits are presented in FIGS. 3 and 4, thus including the components that are required to adjust the direct voltage operating point and the direct voltage decoupling.

Figure 3:
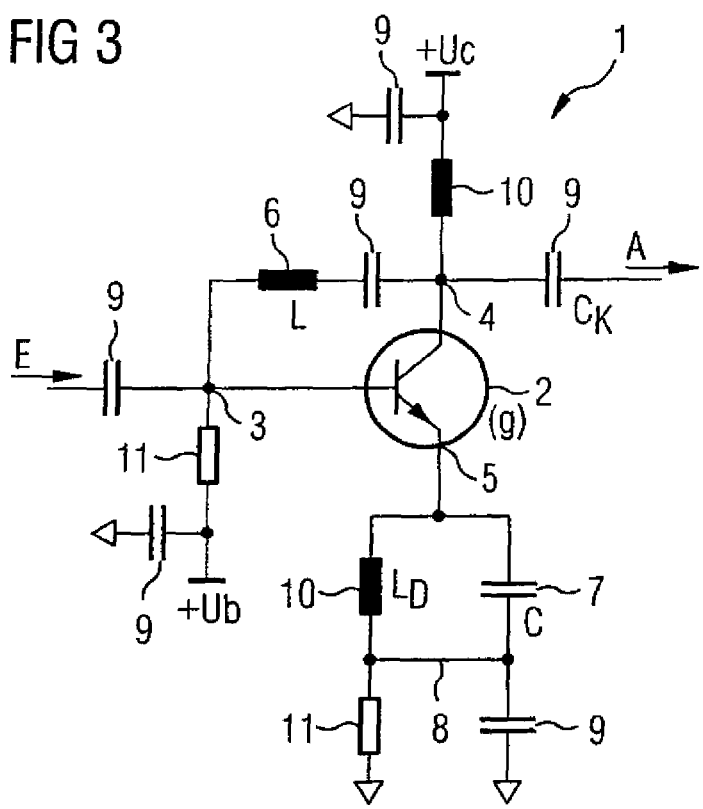
Figure 4:
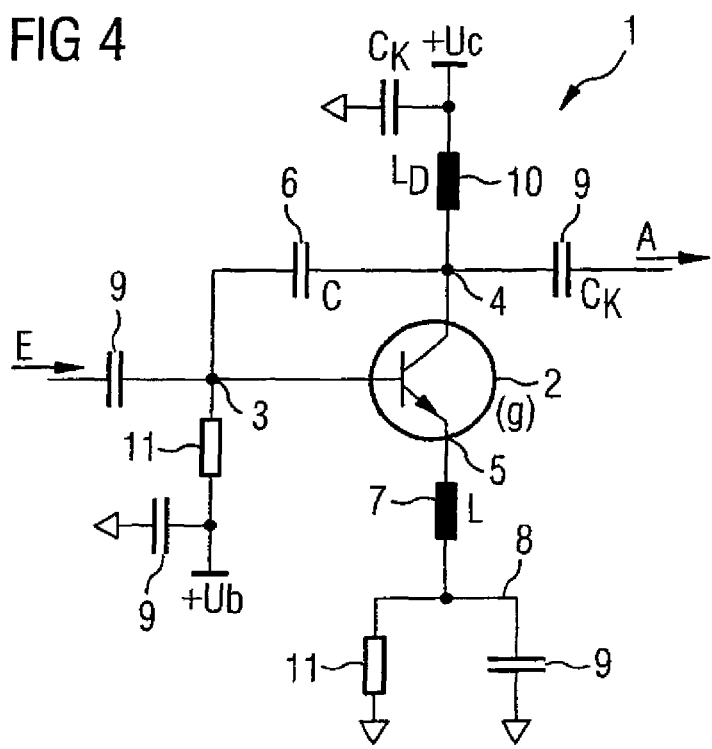

In comparison to FIGS. 1 and 2, coupling capacitors 9 are present in FIGS. 3 and 4. They exhibit capacitance values $C_K$ which satisfy the relationship $$\frac{1}{\omega C_K} \ll \mathrm{MIN}(\omega L, Z_E, Z_A).$$

wherein $\omega$ corresponds to the monofrequent or quasi-monofrequent input signal E of the nominal angular frequency $\omega_0$. In operation in a larger frequency band $\omega$, it corresponds to the minimum frequency fmin multiplied with the factor $2\pi$. The inequality "$\ll$" hereby normally means a difference by at least one order of magnitude, thus a factor of 10. The capacitance values $C_K$ of the coupling capacitors 9 can be equal among one another, but this is not absolutely necessary.

Furthermore, choke inductors 10 are present in FIGS. 3 and 4 in comparison to FIGS. 1 and 2. The choke inductors 10 exhibit inductance values $L_D$ that satisfy the condition $$\omega L_D \gg \mathrm{MAX}\left(\frac{1}{\omega C_K}, Z_A\right).$$

wherein $\omega$ is defined as before. The designation "$\gg$" normally means a difference in magnitude by at least one order of magnitude, thus by a factor of 10. The inductance values $L_D$ of the choke inductors 10 can be the same, but this is not absolutely necessary.

Operating point resistors 11 also are present in FIGS. 3 and 4 in comparison to FIGS. 1 and 2. The operating point resistors 11 are dimensioned as needed. The operating point resistor 11 connected with the input terminal must hereby be dimensioned large relative to the source impedance associated with the input terminal 3, since otherwise it would negatively influence the noise response of the amplifier circuit 1. It can possibly be replaced by a choke inductor. The input impedance $Z_E$ normally exhibits the same value as the source impedance, such that normally the input impedance $Z_E$ can be used as a gauge for dimensioning the operating point resistance 11 (or, the choke inductance replacing the operating point resistance 11).

The amplifier circuits 1 of FIGS. 1 through 4 were simulated on the basis of a bipolar transistor of type BFR193 and with an amplification of 10 dB at 10 MHz. A noise factor of 1.3 dB resulted. By contrast, a comparable simulation with ohmic negative feedback resistors delivered a noise factor of approximately 3.7 dB.

If the input signal E is monofrequent or relatively narrow-band, the amplifier circuits 1 according to FIGS. 1 through 4 operate entirely satisfactorily. However, if the input signal E is broadband—thus a quotient between the maximum frequency fmax and the minimum frequency fmin is relatively large—it works out to be disadvantageous that the amplification factor g in the amplifier circuits 1 of FIGS. 1 through 4 is frequency-dependent. In the case of a relatively large frequency range to be covered, an embodiment as is explained in the following in connection with FIG. 5 is therefore preferred.

According to FIG. 5, two amplifier circuits 1 according to the invention are connected with one another in series. The output signal A of the one amplifier circuit 1 thus corresponds to the input signal E of the other amplifier circuit 1. According to FIG. 5, the upstream amplifier circuit 1 (whose output signal A is supplied to the other amplifier circuit 1) is fashioned corresponding to FIG. 1 or, respectively, FIG. 3. The other amplifier circuit 1 (which receives the output signal A of the first cited amplifier circuit 1 as an input signal E) is fashioned corresponding to FIG. 2 or FIG. 4. However, the order of the two amplifier circuits could also be switched.

The amplification factors g of the amplifier circuits 1 can be selected independent of one another. They can be equal or unequal among one another (thus from the one amplifier circuit 1 to the other amplifier circuit 1). It need only be assured that the product of the amplification factors g of the amplifier circuits 1 is equal to a desired total amplification.

The series circuit according to FIG. 5 has a relatively flat frequency response over the total amplification. In a simulation of such a series circuit (again based on the transistor type BFR193 and with a total amplification of 10 dB at 10 MHz), it extends over more than two octaves, concretely from 4.2 MHz to 20.3 MHz. Furthermore, the noise factor was approximately 1.3 dB.

It is possible to arrange the two amplifier circuits 1 from FIG. 5 on a printed circuit board common to the amplifier circuits 1. However, according to FIG. 5, each of the amplifier circuits 1 is arranged on its own printed circuit board 12. The circuit boards 12 can be arranged far removed from one another. The amplifier circuits 1 are hereby connected with one another via a shielded cable 13 (normally a coaxial cable 13) that possesses a suitable characteristic impedance.

In a preferred application of the present invention, the amplifier circuit 1 (or in the case of a series circuit of multiple amplifier circuits 1, at least one of the amplifier circuits 1) is located in the region of influence of the basic magnet of a magnetic resonance system, thus the magnet that generates the static basic magnetic field that, together with the gyromagnetic ratio of the atomic nuclei to be detected, determines the Larmor frequency. It is particularly preferred if this amplifier circuit 1 or these amplifier circuits 1 is or, respectively, are arranged in proximity to a local coil arrangement 14, in particular is or, respectively, are integrated into this. For example, the downstream amplifier circuit 1 (if it is present) can be arranged near an evaluation device 15 of the magnetic resonance system, in particular can be integrated into this. In this embodiment (but in principle also in other embodiments) the shielded cable 13 can in particular extend over a significant length, for example multiple meters.

Although modifications and changes may be suggested by those skilled in the art, it is the intention of the inventors to embody within the patent warranted hereon all changes and modifications as reasonably and properly come within the scope of their contribution to the art.

We claim as our invention:

1. An amplifier circuit comprising:
   a transistor element having an input terminal supplied with an input signal that is to be amplified, an output terminal at which the amplified input signal is emitted as an output signal, and a third terminal;
   a first reactance connecting said input terminal with said output terminal;
   a second reactance connecting said third terminal to a zero potential;
   one of said first reactance and said second reactance being an inductor and the other of said first reactance and said second reactance being a capacitor; and
   said inductor having an inductance value and said capacitor having a capacitance value dimensioned to make a quotient of the inductance value and the capacitance value equal to the product of a desired input impedance effective at the input terminal and an output impedance associated with the output terminal, causing said output impedance associated with the output terminal to be mapped to the input terminal at the same level or at a scaled level.

2. An amplifier circuit as claimed in claim 1 wherein said transistor element is selected from the group consisting of bipolar transistors and field effect transistors.

3. An amplifier circuit as claimed in claim 1 wherein said first reactance is an inductor and said second reactance is a capacitor.

4. An amplifier circuit as claimed in claim 3, wherein the inductance value of the inductor and the capacitance value of the capacitor satisfy the relationships $$L = \frac{g\sqrt{Z_E Z_A}}{\omega_0} \text{ and } C = \frac{g}{\omega_0 \sqrt{Z_E Z_A}},$$

wherein L is the inductance value, C is the capacitance value, $\omega_0$ is a nominal frequency multiplied by $2\pi$, g is an amplification factor effective at the nominal frequency, $Z_E$ is the desired input impedance effective at the input terminal and $Z_A$ is the output impedance associated with the output terminal.

5. An amplifier circuit as claimed in claim 1 wherein said first reactance is a capacitor and said second reactance is an inductor.

6. An amplifier circuit as claimed in claim 5, wherein the inductance value of the inductor and the capacitance value of the capacitor satisfy the relationships $$L = \frac{g\sqrt{Z_E Z_A}}{\omega_0} \text{ and } C = \frac{g}{\omega_0 \sqrt{Z_E Z_A}},$$

wherein L is the inductance value, C is the capacitance value, $\omega_0$ is a nominal frequency multiplied by $2\pi$, g is an amplification factor effective at the nominal frequency, $Z_E$ is the desired input impedance effective at the input terminal and $Z_A$ is the output impedance associated with the output terminal.

7. An amplifier circuit comprising:

a first amplifier sub-circuit connected in series with a second amplifier sub-circuit;

said first amplifier sub-circuit comprising a first transistor element having a first transistor element input terminal supplied with an input signal that is to be amplified, a first transistor element output terminal at which the amplified input signal is emitted as an output signal, and a first transistor element third terminal, a first reactance connecting said a first transistor element input terminal with said first transistor element output terminal, a second reactance connecting said first transistor element third terminal to a zero potential, one of said first reactance and said second reactance being a first inductor and the other of said first reactance and said second reactance being a first capacitor, and said first inductor having a first inductance value and said first capacitor having a first capacitance value dimensioned to make a quotient of the first inductance value and the first capacitance value equal to the product of a desired input impedance effective at the first transistor element input terminal and an first transistor element output impedance associated with the first transistor element output terminal, causing said first transistor element output impedance associated with the first transistor element output terminal to be mapped to the first transistor element input terminal at the same level or at a scaled level; and said second amplifier sub-circuit comprising a second transistor element having a second transistor element input terminal supplied with the output signal from the first transistor element that is to be amplified, a second transistor element output terminal at which the amplified output signal from the first transistor element signal is emitted as an output signal of the second transistor element, and a second transistor element third terminal, a third reactance connecting said second transistor element input terminal with said second transistor element output terminal, a fourth reactance connecting said second transistor element third terminal to said zero potential, one of said third reactance and said fourth reactance being a second inductor and the other of said third reactance and said fourth reactance being a second capacitor, and said second inductor having a second inductance value and said second capacitor having a second capacitance value dimensioned to make a quotient of the second inductance value and the second capacitance value equal to the product of a desired input impedance effective at the second transistor element input terminal and an output impedance associated with the second transistor element output terminal, causing said output impedance associated with the second transistor element output terminal to be mapped to the second transistor element input terminal at the same level or at a scaled level.

8. An amplifier circuit as claimed in claim 7 comprising a first printed circuit board carrying said first amplifier sub-circuit and a second printed circuit board carrying said second amplifier sub-circuit, said first and second circuit boards being separated from each other and said first and second amplifier sub-circuits being connected in series by a shielded cable having a characteristic impedance matched to said first and second amplifier sub-circuits.

* * * * *